(12) United States Patent
Alexeff

(10) Patent No.: US 6,232,723 B1
(45) Date of Patent: May 15, 2001

(54) DIRECT CURRENT ENERGY DISCHARGE SYSTEM

(76) Inventor: Igor Alexeff, 2790 Oak Ridge Turnpike, Oak Ridge, TN (US) 37830

( * ) Notice: Subject to any disclaimer, the term of this patent is extended or adjusted under 35 U.S.C. 154(b) by 0 days.

(21) Appl. No.: 09/501,110

(22) Filed: Feb. 9, 2000

(51) Int. Cl.[7] ....................................................... H01J 7/24
(52) U.S. Cl. ................................ 315/111.21; 315/111.41; 315/111.51; 313/231; 118/723; 156/345
(58) Field of Search ........................... 315/111.21, 111.41, 315/111.51; 313/231; 118/723

(56) References Cited

U.S. PATENT DOCUMENTS

| | | | |
|---|---|---|---|
| 4,222,838 | * 9/1980 | Bhagat et al. | 204/192 E |
| 4,810,935 | * 3/1989 | Boswell | 315/111.41 |
| 5,266,146 | * 11/1993 | Ohno et al. | 156/345 |
| 6,001,431 | * 12/1999 | Itoh et al. | 427/569 |

* cited by examiner

Primary Examiner—Don Wong
Assistant Examiner—Jimmy Vu
(74) Attorney, Agent, or Firm—Luedeka, Neely & Graham, P.C.

(57) ABSTRACT

An apparatus for producing a plasma with a direct current. A nonmetallic first electrode, having a first surface and a second surface, has pores formed between the first and second surfaces. A conductive liquid is dispersed within the pores of the nonmetallic first electrode. The conductive liquid provides direct current pathways through the nonmetallic first electrode. A second electrode also has a first surface and a second surface. A direct current source provides a first direct current electrical potential and second direct current electrical potential. A first conductive connector is electrically connected to the direct current source, and is disposed adjacent the first surface of the nonmetallic first electrode. The first conductive connector receives the first direct current electrical potential from the direct current source and provides the first direct current electrical potential to the nonmetallic first electrode. A second conductive connector is electrically connected to the direct current source, and is disposed adjacent the first surface of the second electrode. The second conductive connector receives the second direct current electrical potential from the direct current source and provides the second direct current electrical potential to the second electrode. A plasma generation region is defined between the second surface of the nonmetallic first electrode and the second surface of the second electrode. The plasma generation region receives a gas that forms the plasma when the first electrical potential is applied to the second surface of the nonmetallic first electrode and the second electrical potential is applied to the second electrode. The first electrical potential is conducted by the conductive liquid through the pores of the nonmetallic first electrode to the second surface of the nonmetallic first electrode.

20 Claims, 1 Drawing Sheet

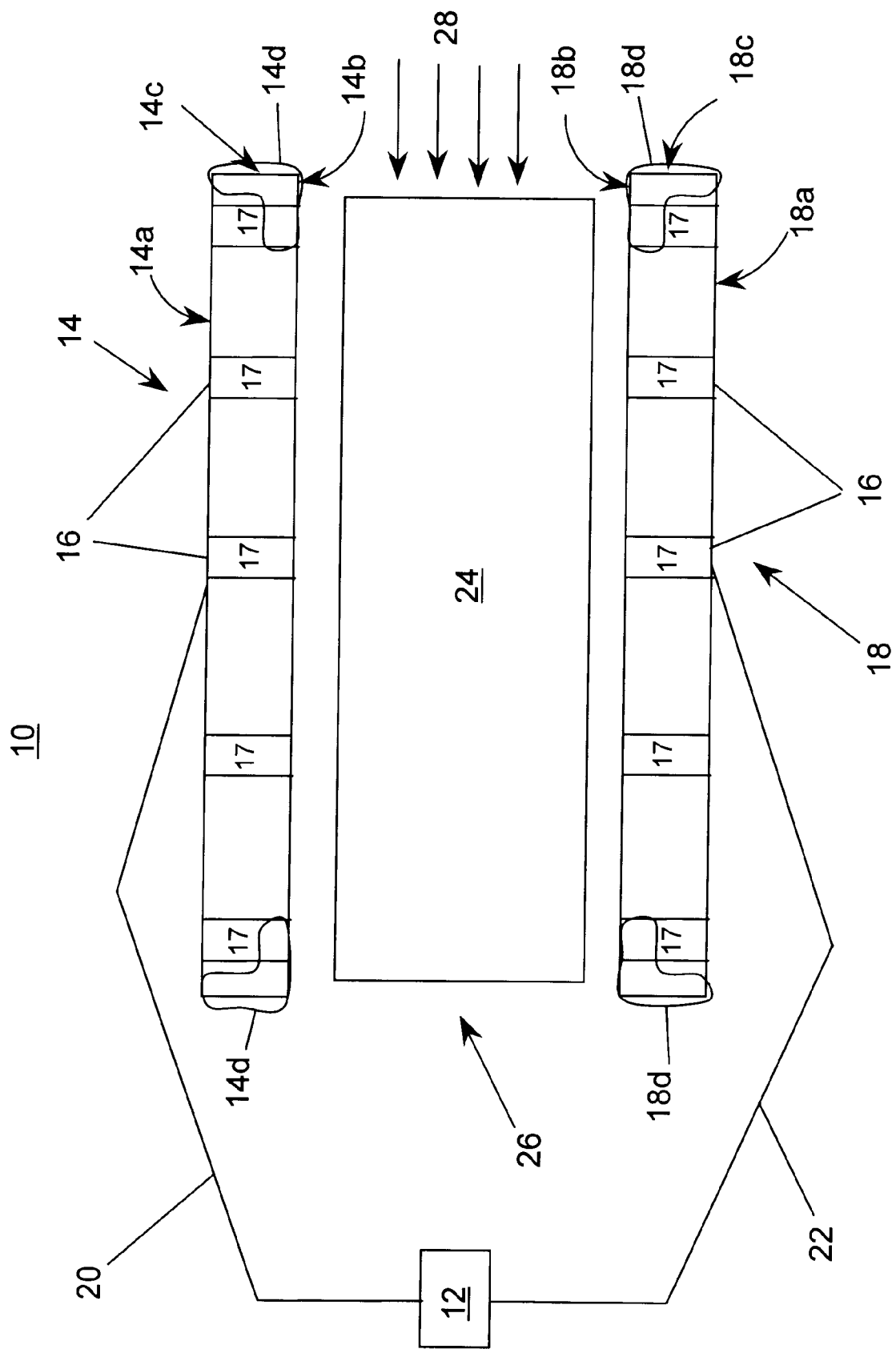

DIRECT CURRENT ENERGY DISCHARGE SYSTEM

TECHNICAL FIELD

This invention relates to the field of direct current energy discharge techniques. More particularly, this invention relates to generating a plasma using a ceramic electrode and a direct current source.

BACKGROUND OF THE INVENTION

A plasma is a collection of charged particles, containing about equal numbers of positive ions and negative ions plus electrons. It is typically an aeroform fluid, like a gas but, unlike most gases, a plasma is a relatively good conductor of electricity and is affected by magnetic fields.

Plasmas can be formed in different ways. One method of forming a plasma is by creating an electrical potential differential between two electrodes that have a medium between them, such as a gas. As the potential increases between the plates, the positive portions of the gas are drawn toward the negatively charged electrode, and the negative portions of the gas are drawn toward the positively charged electrode. At a certain potential, the valence electrons or other negative components of certain gases are torn from the rest of the species, creating positive ions, negative ions, and free electrons. These ions and electrons tend to dissociate as described above and recombine repeatedly in the plasma. However, during the times when they exist as charged species, they tend to make the plasma very reactive.

Plasma generation devices are powered by radio frequency current sources, lower frequency alternating current sources, or direct current sources. Electrodes are fashioned from both metallic and nonmetallic materials. However, direct current sources do not tend to work reliably with metallic or nonmetallic electrodes but, rather, tend to initially arc from a somewhat random location, and then preferentially arc from that location thereafter. Thus, the combination of direct current and nonmetallic electrodes typically does not produce a uniform and well defined plasma.

A radio frequency current source can be used with nonmetallic electrodes to form a uniform plasma. However, radio frequency current sources tend to be somewhat inefficient and have other drawbacks in certain applications. For example, radio frequency current sources have a detectable radio frequency signature, which may be undesirable. They also tend to be more expensive than direct current sources. Thus, there is a need for a direct current plasma generation system that will not arc.

SUMMARY OF THE INVENTION

These and other needs are met by an apparatus for producing a plasma with a direct current. A nonmetallic first electrode, having a first surface and a second surface, has pores formed between the first and second surfaces. A conductive liquid is dispersed within the pores of the nonmetallic first electrode. The conductive liquid provides direct current pathways through the nonmetallic first electrode. The conductive liquid in a pore acts as a current—limiting resistor that suppresses arcing to that pore. A second electrode also has a first surface and a second surface. A direct current source provides a first direct current electrical potential and second direct current electrical potential.

A first conductive connector is electrically connected to the direct current source, and is disposed adjacent the first surface of the nonmetallic first electrode. The first conductive connector receives the first direct current electrical potential from the direct current source and provides the first direct current electrical potential to the nonmetallic first electrode. A second conductive connector is electrically connected to the direct current source, and is disposed adjacent the first surface of the second electrode. The second conductive connector receives the second direct current electrical potential from the direct current source and provides the second direct current electrical potential to the second electrode.

A plasma generation region is defined between the second surface of the nonmetallic first electrode and the second surface of the second electrode. The plasma generation region receives a gas that forms the plasma when the first electrical potential is applied to the second surface of the nonmetallic first electrode and the second electrical potential is applied to the second electrode. The first electrical potential is conducted by the conductive liquid through the pores of the nonmetallic first electrode to the second surface of the nonmetallic first electrode.

The apparatus disclosed herein generates a plasma using a direct current source and nonmetallic electrodes. Because the conductive liquid provides current pathways through the nonmetallic first electrode, charges do not tend to excessively accumulate at the second surface of the nonmetallic first electrode, and then suddenly discharge by arcing as occurs in other systems. Arcing is further reduced and a more uniform plasma is generated by providing pores in the nonmetallic first electrode that do not carry too much current through the nonmetallic first electrode in any one location. This is accomplished, at least in part, by pores that do not have too great a cross-sectional area, so that no one pore carries too great an amount of current. This is also accomplished by having a pore density that is not too great in any one area of the nonmetallic first electrode, so that a large portion of the current flow does not occur within a small surface area of the nonmetallic first electrode.

In a method for producing a plasma, a nonmetallic first electrode is provided, where the nonmetallic first electrode has a first surface and a second surface. The nonmetallic first electrode forms pores between the first surface of the nonmetallic first electrode and the second surface of the nonmetallic first electrode. A first conductive liquid is dispersed within the pores of the nonmetallic first electrode. The first conductive liquid provides direct current pathways from the first surface of the nonmetallic first electrode through the pores to the second surface of the nonmetallic first electrode.

A second electrode is also provided, and the second electrode also has a first surface and a second surface. A plasma generation region is formed between the second surface of the first electrode and the second surface of the second electrode. A first conductive connector is connected to the first surface of the nonmetallic first electrode, and a second conductive connector is connected to the first surface of the second electrode. A direct current source is connected to each of the first conductive connector and the second conductive connector and a gas is introduced within the plasma generation region.

A first electrical potential is applied with the direct current source to the first conductive connector, which thereby applies the first electrical potential to the nonmetallic first electrode. The first electrical potential is received at the first surface of the nonmetallic first electrode, and is conducted from the first surface of the nonmetallic first electrode via the conductive liquid through the pores of the nonmetallic first electrode to the second surface of the nonmetallic first electrode.

A second electrical potential is applied with the direct current source to the second conductive connector, which thereby applies the second electrical potential to the second electrode. A plasma is thereby formed with the gas within the plasma generation region.

BRIEF DESCRIPTION OF THE DRAWINGS

Further advantages of the invention will become apparent by reference to the detailed description of preferred embodiments when considered in conjunction with the drawing, which is not to scale, and which is a functional schematic of a direct current plasma generation apparatus.

DETAILED DESCRIPTION OF THE INVENTION

The use of atmospheric pressure plasmas in industry is becoming widespread. One application is in the sterilization of surfaces such as in medical instruments. One major pharmaceutical supplier is now marketing such a device. Another application is modifying the chemical composition of gases, especially for decontamination purposes. Another application is in modifying the surface properties of materials. For example some plastics will not accept ink unless the surface has been modified. Still another application is for the military in modifying the electrical properties of air to prevent damage by microwave weapons. More applications are appearing every day.

With reference now to the figure there is shown an apparatus 10 for producing a plasma with a direct current source 12. The size of the direct current source 12 is dependent on the particular application of the apparatus 10, as described more completely below. Preferably, the direct current source 12 has an output voltage of between about five kilovolts and about fifty kilovolts, and most preferably about twenty-five kilovolts. Direct current source 12 preferably has an output current of between about fifty microamperes and about 100 milliamperes, and most preferably about one milliampere. In one specialized embodiment a low frequency alternating current source is used as the current source 12, such as a sixty-hertz alternating current source of the type used with a neon sign. The advantage of a direct current source 12 is that the discharge does not extinguish every half-cycle, as it does with the alternating current source or the radio frequency current source. Accordingly, a direct current source 12 provides a substantially constant discharge, which tends to produce to a more predictable plasma.

The apparatus 10 includes a nonmetallic first electrode 14. The nonmetallic first electrode 14 has a first surface 14a and a second surface 14b. Suitable materials for the nonmetallic first electrode 14 include, but are not limited to, ceramic, sandstone, terra cotta, and sintered glass. Some of these materials are relatively inexpensive and are relatively easily formed into the desired shapes for the nonmetallic first electrode 14.

The nonmetallic first electrode 14 is porous, meaning that there are pores 16 located within the volume of nonmetallic first electrode 14. The pores 16 extend from the first surface 14a of the nonmetallic first electrode 14 through the interior of the nonmetallic first electrode 14 and to the second surface 14b of the nonmetallic first electrode 14. The pores 16 are preferably of a size that produce a capillary effect when in contact with a liquid, meaning that a liquid applied to the first surface 14a is wicked into and passes through the pores 16 and reaches the second surface 14b of the nonmetallic first electrode 14.

As explained briefly above, one problem that has been encountered when using a direct current source with nonmetallic electrodes, is that before the plasma ignites, the current is preferentially discharged at a point location on the second surface 14b of the nonmetallic electrode. This condition is called "arcing." After the electrode arcs, current tends to preferentially discharge from that point on the nonmetallic electrode during all subsequent attempts to ignite the plasma. Thus, the nonmetallic electrode is rendered substantially inoperable by the arcing.

For reasons that are more fully described hereafter, a relatively more uniform distribution of pores 16 within the nonmetallic first electrode 14 tends to reduce the occurrence of arcing from that exhibited by a nonmetallic first electrode 14 having a relatively less uniform distribution of pores 16. Further, and also as more completed described hereafter, a relatively greater number of pores 16 within the nonmetallic first electrode 14 also tends to reduce the occurrence of arcing as compared to a nonmetallic first electrode 14 having a relatively fewer number of pores 16 within it. However, the number of pores 16, as defined by the relative amount of total volume of the pores 16 to the total volume of the nonmetallic electrode 14 also has a preferred upper limit, for reasons as described more completely below.

Arcing may occur above acceptable limits at the second surface 14b of the nonmetallic first electrode 14 if the pore 16 density is too high or too low. Moreover, arcing may occur if the pore 16 size is too large compared to the size of the nonmetallic first electrode 14, or if the pores 16 are only concentrated within relatively small areas within the nonmetallic first electrode 14, rather than being more uniformly distributed. Either of these conditions may produce a point on the second surface 14b of the nonmetallic first electrode 14 where currently preferentially flows, and thus from which arcing may occur.

In an alternate embodiment of the present invention, the first nonmetallic electrode 14 is configured with the nonmetallic first electrode 14 encased at the edges of at least the second surface 14b by a nonporous or vitreous portion 14d of the first nonmetallic electrode 14. The vitreous portion 14d may also surround the side walls 14c of the nonmetallic first electrode 14. The vitreous portion 14d is preferably limited to portions of the first surface 14a and second surface 14b of the nonmetallic first electrode 14 that are proximate the side walls 14c of the nonmetallic first electrode 14, and does not extend across an appreciable amount of the surface areas of the first and second surfaces 14a and 14b of the nonmetallic first electrode 14.

Since the vitreous portion 14d does not contain pores 16 that contact at least the second surface 14b of the nonmetallic first electrode 14, the vitreous portion 14d acts as a barrier, blocking the conductive liquid 17 from reaching the second surface 14b of the nonmetallic first electrode 14. Correspondingly, there are no direct current pathways to the second surface 14b created by the conductive liquid 17 in these areas near the side walls 14c. Thus, the amount of current that can be conducted to the second surface 14b in these areas near the side walls 14c is dramatically reduced, which tends to inhibit arcing near the side walls 14c. The vitreous portion 14d of the nonmetallic first electrode 14 is preferably formed of the same materials as that selected for the nonmetallic first electrode 14.

There are a variety of potential embodiments for the vitreous portion 14d. In one embodiment, the vitreous portion 14d is a thin layer of nonporous material having a raised outer periphery that completely surrounds the side walls 14c of the nonmetallic first electrode 14. In another embodiment, the vitreous portion 14d is a thicker layer of nonporous material that completely surrounds the side walls 14c of the nonmetallic first electrode 14.

Reducing the amount of surface area of the first and second surfaces 14a and 14b of the nonmetallic first electrode 14 that the vitreous portion 14d occupies results in a larger plasma generation region 24. However, reducing the vitreous portion 14d too much may allow arcing to occur at the side walls 14c of the nonmetallic first electrode 14. Conversely, increasing the amount of surface area of the first surface 14a and second surface 14b of the nonmetallic first electrode 14 that the vitreous portion 14d occupies tends to result in a smaller plasma generation region 24, but may tend to reduce arcing at the side walls 14c more effectively.

An electrically conductive liquid 17 is disposed within the pores 16 of the nonmetallic first electrode 14. The conductive liquid 17 creates conductive pathways through the nonmetallic first electrode 14 within the pores 16. These conductive pathways provide for conduction of current from the first surface 14a of the nonmetallic first electrode 14 through the pores 16 to the second surface 14b of the nonmetallic first electrode 14. The importance of these conductive pathways is described in detail below.

Preferably, the electrically conductive liquid 17 is applied to the first surface 14a of the nonmetallic first electrode 14. Once applied to the first surface 14a of the nonmetallic first electrode 14, the conductive liquid 17 permeates the pores 16, electrically connecting the first surface 14a with the second surface 14b of the nonmetallic first electrode 14, via the conductive liquid 17. The conductive liquid 17 is applied to the first surface 14a rather than the second surface 14b to reduce any potentially disruptive additional chemical reactions within the plasma generation region 24. If a conductive liquid 17, such as water, was applied directly to the second surface 14b of the nonmetallic first electrode 14, additional unwanted ionized components of the water might interact with the plasma 26, which tends to inhibit the desired effects of the plasma 26.

Furthermore, unwanted additional chemical components provided by the conductive liquid 17 within the plasma generation region 24 might tend to make the plasma 26 less predictable. Moreover, any mechanism used to apply the conductive liquid 17 to the second surface 14b might protrude into the plasma generation region 24 and interfere with the generation of the plasma 26. If the mechanism protrudes into the plasma generation region 24, the electromagnetic field may be disrupted, which may further inhibit the effectiveness of plasma 26.

For a highly porous nonmetallic first electrode 14, the conductive liquid 17 is preferably applied to the first surface 14a of the nonmetallic first electrode 14 in an amount so as to not provide an excess of the conductive liquid 17 at the second surface 14b of the nonmetallic first electrode 14. In other words, it is preferred that the second surface 14b of the nonmetallic first electrode 14 accommodates a minimal amount of the conductive liquid 17 after the conductive liquid 17 permeates the pores 16 of the nonmetallic first electrode 14. If the conductive liquid 17 is allowed to encompass the second surface 14b of the nonmetallic first electrode 14, the problems described above may occur. Moreover, the conductive liquid 17 is preferably applied in a manner that precludes a substantial amount of the conductive liquid 17 from reaching the side wall 14c of the nonmetallic first electrode 14. If the conductive liquid 17 reaches the side wall 14c of the nonmetallic first electrode 14, arcing may occur at the side wall 14c, which tends to render the nonmetallic first electrode 14 unusable. Preferred conductive liquids include, but are not limited to, water, hydrogen peroxide, glycerin, and combinations thereof.

The conductive liquid 17 may be applied to the first surface 14a of the nonmetallic first electrode 14 automatically or manually. In one embodiment of the present invention, the conductive liquid 17 is applied by slowly pouring the conductive liquid 17 onto the first surface 14a of the nonmetallic first electrode 14. Alternately, an automatic application means may be used to automatically apply the conductive liquid 17 to the first surface 14a of the nonmetallic first electrode 14. The automatic application means may be programmable to apply predetermined amounts of the conductive liquid 17 over a period of time, to allow for evaporation of the conductive liquid 17.

For a highly porous nonmetallic first electrode 14, a lower amount of conductive liquid 17 may be applied to prevent the unwanted effects as described above. However, for a nonmetallic first electrode 14 having a large surface area, a larger amount of the conductive liquid 17 may be warranted to ensure sufficient permeation of the pores 16. Depending on the specific size and porosity of nonmetallic first electrode 14, sufficient permeation of the pores 16 means that the conductive liquid 17 has permeated the pores 16 sufficiently to provide a substantial amount of direct current pathways through the nonmetallic first electrode 14.

A predetermined amount of time for applying the conductive liquid 17 may be provided to prevent the conductive liquid 17 from reaching the side walls 14c or second surface 14b of the nonmetallic first electrode 14. The predetermined amount of time for applying the conductive liquid 17 may depend at least in part on the porosity of the nonmetallic first electrode 14. If the nonmetallic first electrode 14 is highly porous, a shorter time for applying the conductive liquid 17 may be warranted to prevent some of the effects described above. Moreover, the automatic application means may apply the conductive liquid 17 based upon the time interval elapsed between a first conductive liquid 17 application and the next time the conductive liquid 17 is applied. The time interval elapsed between the conductive liquid 17 applications determines when to apply the conductive liquid 17 and when to limit application of the conductive liquid 17 to the first surface 14a of the nonmetallic first electrode 14, again avoiding the above described problems. For a highly porous nonmetallic first electrode 14, a longer time interval may be required, that is, a longer time elapses between the first time that the conductive liquid 17 is applied and the next time that the conductive liquid 17 is applied.

It may be preferred to apply the conductive liquid 17 to the first surface of the nonmetallic first electrode 14 in a manner such that a pool of the conductive liquid 17 remains on the first surface 14a of the nonmetallic first electrode 14. This pool of conductive liquid 17 acts to connect the permeated pores 16 and the first conductive connector 20, providing for an additional electrical connection between the first conductive connector 20 and the permeated pores 16. The pool may tend to distribute the direct current more uniformly to the permeated pores 16, which may provide for a more predictable plasma 26 within the plasma generation region 24 when the direct current source 12 is applied.

The invention does not require that a pool of the conductive liquid 17 remain on the first surface 14a of the nonmetallic first electrode 14. If a pool of the conductive liquid 17 is not provided for on the first surface 14a of the nonmetallic first electrode 14, a larger connection, such as a metallic block, may be used to encompass a larger area of the first surface 14a of the nonmetallic first electrode 14. By encompassing a larger area of the first surface 14a of the nonmetallic first electrode 14, a larger number of permeated pores 16 have direct electrical connection to the first conductive connector 20, and receive direct current directly from the first conductive connector 20 once the direct current source 12 is applied.

However, if a pool of the conductive liquid 17 does not remain on the first surface 14a of the nonmetallic first electrode 14, the direct current pathways begin at the pore 16 or pores 16 at which the first connective connector 20 is placed. Once the direct current supply 12 is applied, the direct current then permeates the other intersecting pores 16 via the pore or pores which receive the direct current first. Moreover, if some of the pores 16 of the nonmetallic first electrode 14 do not intersect any other pores 16 and also do not receive the first direct current, there may be a pore 16 or pores 16 which are not conducting any of the direct current. That is, any non-intersecting pores 16 may not receive direct current because there is not a "connected" circuit. If there are pores 16 that are not connected, this may tend to result in a plasma 26 that is not as predictable as a plasma wherein all of the pores 16 of the nonmetallic first electrode 14 are electrically connected, that is, transmitting direct current.

The first conductive conductor 20 provides a direct current pathway between direct current source 12 and the nonmetallic first electrode 14. When the direct current source 12 is connected, the first conductive connector 20 provides a first direct current electrical potential to the nonmetallic first electrode 14.

The apparatus 10 further includes a second electrode 18, having a first surface 18a and a second surface 18b. In a preferred embodiment of the present invention, the nonmetallic first electrode 14 and second electrode 18 are configured so that the second surface 14b of the nonmetallic first electrode 14 is substantially parallel to the second surface 18b of the second electrode 18. Maintaining the nonmetallic first electrode 14 and the second electrode substantially parallel tends to generate a more uniform electromagnetic field between the second surface 14b of the nonmetallic first electrode 14 and the second surface 18b of the second electrode 18. Correspondingly, a substantially uniform electromagnetic field tends to produce a more predictable plasma 26 within the plasma generation region 24.

The operation of apparatus 10 is not dependent on the type of material selected for the second electrode 18. Correspondingly, the second electrode 18 may, in various alternate embodiments, be formed from a nonmetallic or a metallic substance. If formed from a nonmetallic substance, the second electrode 18 is preferably constructed according to the same criteria as described for the construction of the first electrode 14.

For example, the second electrode 18 may be formed of a porous nonmetallic material, preferably of a material having properties substantially similar to the nonmetallic first electrode 14. To create direct current pathways through such a nonmetallic second electrode 18, a second electrically conductive liquid 17 is applied to the first surface 18a of the second electrode 18. The conductive liquid 17 permeates the pores 16 of the second electrode 18 and renders the nonconductive nonmetallic electrode 18 a highly resistive conductor, having a resistivity on the order of mega-ohms per cubic meter of the material. Preferred conductive liquids include those described for the first electrically conductive liquid 17. As described above, the second conductive liquid 17 may be applied to the first surface 18a of the second electrode 18 manually or automatically.

A first conductive connector 20 electrically connects the nonmetallic first electrode 14 to the direct current source 12. Preferably, first conductive connector 20 is connected to the nonmetallic first electrode 14 at the first surface 14a. The connection of the first conductive connector 20 at the first surface 14a of the nonmetallic first electrode 14 may be relatively simple, such as a copper wire secured by a piece of electrical tape. Alternately, a metallic block having a surface that is generally about the same size as the surface area of the first surface 14a of the nonmetallic first electrode 14 is disposed adjacent the first surface 14a of the nonmetallic first electrode 14. The conductive connector 20 is then connected to the metallic block, providing an electrical connection between the metallic block and the nonmetallic first electrode 14.

A second conductive connector 22 electrically connects the second electrode 18 to the direct current source 12. Preferably, the second conductive connector 22 is connected to the second electrode 18 at the first surface 18a. The second conductive conductor 22 provides a direct current pathway between the direct current source 12 and the second electrode 18. The second conductive conductor 22 may be similar to the first conductive conductor 20, in that it may be relatively simple, such as a copper wire secured by a piece of electrical tape. Alternately, a metallic block having a surface that is generally about the same size as the first surface 18a of the second electrode 18 is disposed adjacent the first surface 18a of the second electrode 18. The conductive connector 22 is then connected to the metallic block, providing an electrical connection between the metallic block and the second electrode 18.

Selection of an appropriate form for the second conductive connector 22 is preferably based at least in part of the design of the second electrode 18. For example, if the second electrode 18 is formed of a metallic substance, then a simpler embodiment of the second conductive connector 22 is preferably used, such as clamping a wire to the metal second electrode 18. However, if the second electrode 18 is formed of a nonmetallic substance, such as that described herein for the nonmetallic first electrode 14, then the second conductive connector 22 may preferably have a form that includes the large metallic block, as described above.

The nonmetallic first electrode 14 and second electrode 18 are adjusted to be closer together or farther apart depending on one or more of several different factors, including the particular application to which the direct current plasma 26 is applied, and the level of voltage differential applied to the nonmetallic first electrode 14 and the second electrode 18. Further, the gas used for the plasma also effects the distance at which the electrodes are spaced. For example, the size of an article to be placed between the nonmetallic first electrode 14 and second electrode 18 tends to determine the minimum electrode spacing required to contain the article within the plasma 26. A larger article tends to require a greater electrode spacing than an article having a smaller size. Distances of from about 0.25 inches to about twelve inches have proven satisfactory with the configurations described herein.

However, again dependent on the particular criteria described above, too large an electrode spacing may degrade the efficiency of plasma generation apparatus 10. Correspondingly, the spacing between the electrodes 14 and 18 is positioned to efficiently maintain the best plasma 26 for a particular plasma 26 application. If a small article is to be placed within the plasma 26, the electrode spacing can be small enough to just contain the article without disturbing the plasma 26, such as by shorting out the plasma 26 between the electrodes 14 and 18, but not so great that the plasma apparatus 10 becomes inefficient, or cannot ignite a plasma. A smaller volume between the electrodes requires less power output from the direct current source 12 than a larger volume requires to generate the same plasma 26 intensity throughout the plasma generation region 24.

According to the present invention, a plasma generation region 24 is defined between the second surface 14b of the nonmetallic first electrode 14 and the second surface 18b of the second electrode 18. The volume of the plasma generation region 24 is defined by the area of the second side 14b of the nonmetallic first electrode 14, the area of the second side 18b of the second electrode 18, and the distance between the nonmetallic first electrode 14 and second electrode 18.

Thus, the volume of plasma generation region 24 may be increased or decreased by varying the distance between the nonmetallic first electrode 14 and the second electrode 18. Preferably, the plasma generation region 24 forms a volume of between about five cubic inches and about one hundred cubic inches. The second surface 14b of the nonmetallic first electrode 14 and the second surface 18b of the second electrode 18 preferably have identical surface areas of between about thirty square inches and about one hundred square inches.

The type of gas 28 used in the flow of gas 28 may be modified to meet the particular needs to which the plasma 26 is applied. Preferably, the gas 28 is air, helium, argon, nitrogen, oxygen, and combinations thereof.

The first electrical potential may be greater than the second electrical potential or the second electrical potential may be greater than the first electrical potential. The potential difference between the first electrical potential and the second electrical potential is preferably between about fifty kilovolts and about one hundred kilovolts.

A direct current glow discharge plasma 26 is generated within the plasma generation region 24 when a gas 28 is introduced into the plasma generation region 24 and the first and second electrical potentials are applied to the nonmetallic first electrode 14 and the second electrode 18. The gas 28 is ionized and forms the plasma 26 within the plasma generation region 24 by an electromagnetic field that is created when the first potential and second potential are applied to the nonmetallic first electrode 14 and the second electrode 18. Preferably, the plasma 26 is generated in the plasma generation region 24 at about one atmosphere of pressure, or at the ambient atmospheric pressure in which the apparatus 10 resides.

In a preferred embodiment, the plasma 26 generated in the plasma generation region 24 has a density of between about $10^{10}$ ions per cubic centimeter and about $10^{12}$ ions per cubic centimeter. Furthermore, during generation of the plasma 26, it is preferable that the second surface 14b of the nonmetallic first electrode 14 and the second surface 18b of the second electrode 18 maintain current densities of between about ten microamperes per square inch and about one hundred microamperes per square inch.

In an alternate embodiment of the present invention, a conduit or supply path is placed adjacent the plasma generation region 24. The conduit transfers the plasma 26 away from the plasma generation region 24 to a different location where the transferred plasma 26 may then be utilized depending on the desired application. Preferably, the conduit has a length of between about one foot and about ten feet, and a cross-section of between about 0.1 square feet and about one square foot. After the plasma 26 is created within the plasma generation region 24, the plasma 26 is either drawn or impelled through the conduit to an application destination. The plasma 26 can be drawn by a pump or other vacuum source, or alternately impelled by a fan or other pressure source through the conduit.

It is contemplated, and is apparent to those skilled in the art from the preceding description and the accompanying drawing, that modifications may be made to the embodiments of the invention described herein, which modifications are within the scope and spirit of the invention. Accordingly, it is expressly intended that the foregoing description and the accompanying drawing are illustrative of preferred embodiments only, not limiting thereto, and that the true spirit and scope of the present invention be determined by reference to the appended claims.

What is claimed is:

1. An apparatus for producing a plasma with a direct current, comprising:

a nonmetallic first electrode having a first surface and a second surface, the nonmetallic first electrode forming pores between the first surface of the nonmetallic first electrode and the second surface of the nonmetallic first electrode, a conductive liquid dispersed within the pores of the nonmetallic first electrode, the conductive liquid providing direct current pathways through the nonmetallic first electrode, a second electrode having a first surface and a second surface, a direct current source for providing a first direct current electrical potential and a second direct current electrical potential, a first conductive connector electrically connected to the direct current source and disposed adjacent the first surface of the nonmetallic first electrode, for receiving the first direct current electrical potential from the direct current source and providing the first direct current electrical potential to the nonmetallic first electrode, a second conductive connector electrically connected to the direct current source and disposed adjacent the first surface of the second electrode, for receiving the second direct current electrical potential from the direct current source and providing the second direct current electrical potential to the second electrode, and a plasma generation region defined between the second surface of the nonmetallic first electrode and the second surface of the second electrode, the plasma generation region for receiving a gas, the gas forming the plasma when the first electrical potential is applied to the second surface of the nonmetallic first electrode and is conducted by the conductive liquid through the pores of the nonmetallic first electrode to the second surface of the nonmetallic first electrode and the second electrical potential is applied to the second electrode.

2. The apparatus of claim 1, wherein the gas within the plasma generation region is at a pressure of about one atmosphere.

3. The apparatus of claim 1, wherein the nonmetallic first electrode is formed from material selected from the group consisting of ceramic, sandstone, terra cotta, and sintered glass.

4. The apparatus of claim 1, wherein the gas is selected from the group consisting of air, helium, argon, nitrogen, and a combination thereof.

5. The apparatus of claim 1, wherein the conductive liquid is selected from the group consisting of water, hydrogen peroxide, glycerin, and a combination thereof.

6. The apparatus of claim 1, wherein the second electrode is formed of a nonmetallic material, the nonmetallic second electrode forming pores between the first surface of the nonmetallic second electrode and the second surface of the nonmetallic second electrode, the nonmetallic second electrode having a second conductive liquid dispersed within the pores of the nonmetallic second electrode, the second conductive liquid providing direct current pathways through the nonmetallic second electrode.

7. The apparatus of claim 1, wherein the plasma generating region forms a volume that is between about five cubic inches and about one hundred cubic inches.

8. The apparatus of claim 1, wherein the first electrical potential is greater than the second electrical potential.

9. The apparatus of claim 1, wherein the second electrical potential is greater than the first electrical potential.

10. The apparatus of claim 1, wherein the first electrical potential is between about fifty kilovolts and about one hundred kilovolts relative to the second electrical potential.

11. The apparatus of claim 1, wherein the conductive liquid is applied to the nonmetallic first electrode at the first surface of the nonmetallic first electrode.

12. The apparatus of claim 1, wherein each of the pores formed within the nonmetallic first electrode has a cross-sectional area that is sufficiently small, and is spaced one from another at a distance that is sufficiently great, and unitedly comprise a volume within the nonmetallic first electrode that is sufficiently uniformly distributed within the nonmetallic first electrode that no arcing occurs between the second surface of the nonmetallic first electrode and the second surface of the second electrode when the first electrical potential is applied to the nonmetallic first electrode and the second electrical potential is applied to the second electrode.

13. The apparatus of claim 1, wherein the nonmetallic first electrode has a surface area of between about thirty square inches and about one hundred square inches.

14. The apparatus of claim 1, wherein the second surface of the nonmetallic first electrode and second surface of the second electrode are substantially parallel to each other, and are disposed from each other at a distance of between about 0.25 inches and about twelve inches.

15. The apparatus of claim 1, wherein the direct current supply provides a direct current through the second surface of the nonmetallic first electrode and the second surface of the second electrode at a current density of between about ten microamperes per square inch and about one hundred microamperes per square inch during plasma generation.

16. The apparatus of claim 1, wherein the direct current supply provides a direct current sufficient to create a plasma density of between about $10^{10}$ ions per cubic centimeter and about $10^{12}$ ions per cubic centimeter.

17. A method for producing a plasma, the method comprising the steps of:

providing a nonmetallic first electrode having a first surface and a second surface, the nonmetallic first electrode forming pores between the first surface of the nonmetallic first electrode and the second surface of the nonmetallic first electrode, dispersing a first conductive liquid within the pores of the nonmetallic first electrode, the first conductive liquid thereby providing direct current pathways from the first surface of the nonmetallic first electrode through the pores to the second surface of the nonmetallic first electrode, providing a second electrode, the second electrode having a first surface and a second surface, forming a plasma generation region between the second surface of the nonmetallic first electrode and the second surface of the second electrode, connecting a first conductive connector to the first surface of the nonmetallic first electrode, connecting a second conductive connector to the first surface of the second electrode, connecting a direct current source to the first conductive connector, connecting the direct current source to the second conductive connector, introducing a gas within the plasma generation region, applying a first electrical potential with the direct current source to the first conductive connector, thereby applying the first electrical potential to the nonmetallic first electrode, receiving the first electrical potential at the first surface of the nonmetallic first electrode, conducting the first electrical potential from the first surface of the nonmetallic first electrode via the conductive liquid through the pores of the nonmetallic first electrode to the second surface of the nonmetallic first electrode, applying a second electrical potential with the direct current source to the second conductive connector, thereby applying the second electrical potential to the second electrode, and forming a plasma with the gas within the plasma generation region.

18. The method of claim 17 wherein the second electrode is a nonmetallic second electrode forming pores, further comprising the step of dispersing a second conductive liquid within the pores of the nonmetallic second electrode, the second conductive liquid thereby providing direct current pathways from the first surface of the nonmetallic second electrode through the pores to the second surface of the nonmetallic second electrode.

19. An apparatus for producing an electromagnetic field, the apparatus comprising:

a nonmetallic first electrode having a first surface and a second surface, the nonmetallic first electrode forming pores between the first surface of the nonmetallic first electrode and the second surface of the nonmetallic first electrode, a conductive liquid dispersed within the pores of the nonmetallic first electrode, the conductive liquid providing direct current pathways through the nonmetallic first electrode, a second electrode having a first surface and a second surface, a direct current source for providing a first direct current electrical potential and a second direct current electrical potential, a first conductive connector electrically connected to the direct current source and disposed adjacent the first surface of the nonmetallic first electrode, for receiving the first direct current electrical potential from the direct current source and providing the first direct current electrical potential to the nonmetallic first electrode, a second conductive connector electrically connected to the direct current source and disposed adjacent the first surface of the second electrode, for receiving the second direct current electrical potential from the direct current source and providing the second direct current electrical potential to the second electrode, and an electromagnetic field generation region defined between the second surface of the nonmetallic first electrode and the second surface of the second electrode, the electromagnetic field generation region for receiving an electromagnetic field when the first electrical potential is applied to the second surface of the nonmetallic first electrode and is conducted by the conductive liquid through the pores of the nonmetallic first electrode to the second surface of the nonmetallic first electrode and the second electrical potential is applied to the second electrode.

20. The apparatus of claim 19, further comprising:

the electromagnetic field generation region for receiving a gas, whereby the gas forms a plasma when the electromagnetic field is generated.

* * * * *